United States Patent [19]
Ruetz

[11] Patent Number: 5,153,534
[45] Date of Patent: Oct. 6, 1992

[54] HIGH FREQUENCY VCO CIRCUIT

[75] Inventor: J. Eric Ruetz, San Bruno, Calif.

[73] Assignee: Samsung Semiconductor, Inc., San Jose, Calif.

[21] Appl. No.: 776,505

[22] Filed: Oct. 10, 1991

[51] Int. Cl.⁵ .............................................. H03K 3/02
[52] U.S. Cl. .................................... 331/111; 331/143; 331/177 R
[58] Field of Search ............... 331/34, 57, 111, 113 R, 331/143, 144, 177 R, DIG. 3

[56] References Cited
U.S. PATENT DOCUMENTS
4,972,162  11/1990  Banu ..................................... 331/111

Primary Examiner—David Mis
Attorney, Agent, or Firm—Townsend and Townsend

[57] ABSTRACT

A high-frequency voltage controlled oscillator includes a start-up circuit for preventing the oscillator from enering a stable state and that does not increase the fixed delays in the oscillator feedback paths. A sleep mode feature shuts down the oscillator to conserve power and capacitors are used to isolate the oscillator from high-frequency noise coupled through the power supply inputs.

6 Claims, 7 Drawing Sheets

|   | d1 | d2 | d3 | d4 | c1 | c2 | c3 | c4 | |
|---|----|----|----|----|----|----|----|----|---|
| $t_0$ | ? | H | L | H | L | H | H | L | ? MOANS LOW, BUT TRANSITION |
| $t_1$ | (H) | H | L | H | L | H | H | L | WAS DEPENDING ON I19, I20 |
| $t_2$ | H | (L) | L | H | L | H | H | L | UNTIL IT REACHES HIGH. |
| $t_3$ | H | L | (H) | H | L | H | H | L | |
| $t_4$ | H | L | H | (L) | L | H | (L) | L | |
| $t_5$ | H | L | H | L | (?) | H | L | (H) | |
| $t_6$ | (L) | L | H | L | ? | H | L | H | |
| $t_7$ | L | (H) | H | L | ? | H | L | H | READY FOR C1 TRANSISTION |
| $t_8$ | L | H | H | L | (H) | H | L | H | (c REPEATS AS d ) |
| $t_9$ | L | H | H | L | H | (L) | L | H | |
| $t_{10}$ | L | H | H | L | H | L | (H) | H | |
| $t_{11}$ | L | H | (L) | L | H | L | H | (L) | |
| $t_{12}$ | (?) | H | L | (H) | H | L | H | L | |
| $t_{13}$ | ? | H | L | H | (L) | L | H | L | |
| $t_0'$ | ? | H | L | H | L | (H) | H | L | READY FOR d1 TRANSITION |
| $t_1'$ | (H) | H | L | H | L | H | H | L | |
| $t_2'$ | H | (L) | L | H | L | H | H | L | |
| $t_3'$ | H | L | (H) | H | L | H | H | L | |
| $t_4'$ | H | L | H | (L) | L | H | (L) | L | |
| $t_5'$ | H | L | H | L | (?) | H | L | (H) | |
| $t_6'$ | (L) | L | H | L | ? | H | L | H | |
| $t_7'$ | L | (H) | H | L | ? | H | L | H | |

Left bracket label: 1 PERIOD OF THE VCO (covering $t_0$ through $t_{13}$)

*FIG. 2.*

HIGH FREQUENCY VCO CIRCUIT

BACKGROUND OF THE INVENTION

Phase-locked loops (PLLs) are utilized in many applications including clock generating chips for personal computers and other digital systems. An important component of a PLL is the voltage controlled oscillator (VCO) which allows a second oscillating signal to be phase locked to a first oscillating signal.

One type of VCO utilizes a latch triggered by voltage signals generated from first and second charging nodes. An input control voltage signal controls the rate at which the nodes are charged so that the output frequency is determined by amplitude of the control voltage signal.

First and second feedback paths couple the first and second charging nodes where each feedback path includes several serially connected circuit elements. Each circuit element introduces a fixed delay into the feedback path and the sum of the fixed delays determines the maximum of operating frequency of the VCO. Accordingly, the sum of the fixed delays must be kept small to operate at high frequencies.

One problem with latch-type oscillators is that they may enter a stable, non-oscillating state during start-up. Thus, some type of circuitry to restart oscillation must be provided. However, this circuitry can introduce delays into the feedback paths and lower the maximum operating frequency of the VCO.

Additionally, the voltage levels at the charging nodes must be very stable for high-frequency operation and thus the VCO must be isolated from high-frequency noise coupled through the power supply inputs. Typically, large filters are utilized to achieve high-frequency isolation.

SUMMARY OF THE INVENTION

The present invention is a high-frequency latch-type VCO. According to one aspect of the invention, a start-up circuit completely external to the feedback paths prevents the oscillator from entering the stable state without increasing the fixed delay caused by the feedback paths.

According to another aspect of the invention, circuitry responsive to a sleep mode signal prevents oscillation during a sleep mode to conserve power when the oscillator output signal is not required. This circuitry does not increase the fixed delays in the oscillator system.

According to a further aspect of the invention, a boost circuit is provided to increase the charging current at high frequencies to offset the effect of the fixed delays of the feedback paths.

According to a still further aspect of the invention, CMOS NAND gates are utilized in the feedback paths and the transistors in the NAND gates are scaled to compensate for changes of charging current due to fluctuations in power supply voltage.

According to a still further aspect of the invention, a high-frequency short circuit is formed to isolate the VCO from high-frequency noise coupled through the power supply inputs and provide stable operation at high frequencies.

Other features and advantages of the invention will be apparent in view of the appended drawings and following detailed description.

BRIEF DESCRIPTION OF THE DRAWINGS

FIG. 2 is diagram depicting the voltage levels of the node signals at the voltage level transition times;

DESCRIPTION OF THE PREFERRED EMBODIMENT

Figure 1:
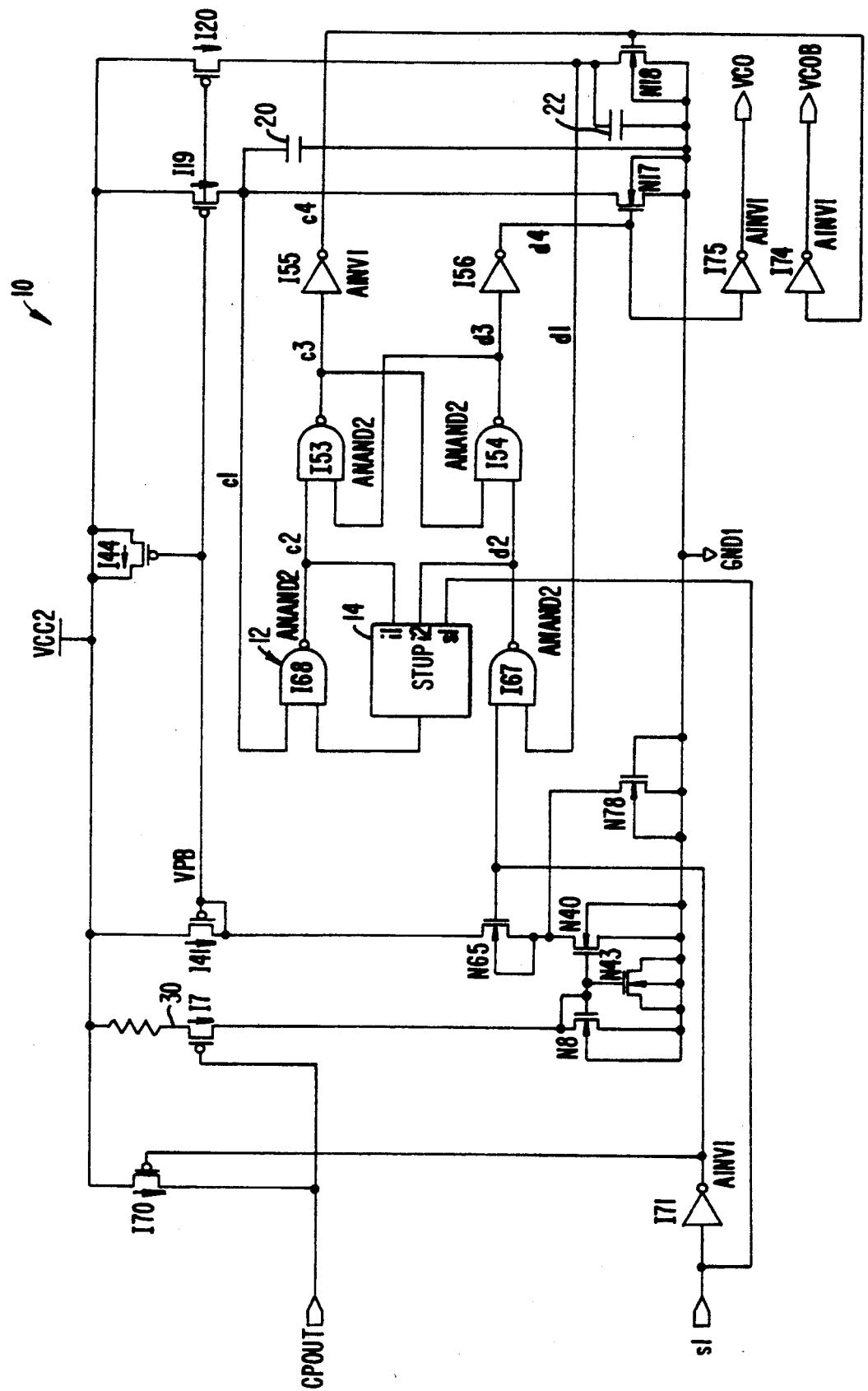
FIG. 1 is a schematic diagram of a latch-type, high-frequency VCO.

FIG. 1 is a schematic diagram of a preferred embodiment of the invention. First and second charging nodes, d1 and c1, are coupled respectively to first and second discharging transistors N17 and N18. A first feedback path, comprising NAND gates I68 and I53 and invertor I55, couples the first charging node c1 to the second discharging transistor N18 and a second feedback path, comprising NAND gates I67 and I54, and invertor I56, couples the second charging node d1 to the first discharging transistor N17.

The upper oscillating frequency of the VCO is limited by the fixed delays introduced by the elements in each feedback path. The circuit depicted has two stable states, an oscillating state and a non-oscillating state. A start-up circuit reacts when the VCO is in the non-oscillating state at start-up to force the VCO into the oscillating state. The start-up circuit 14 is exterior to the first and second feedback paths so that no additional delay is introduced into those paths to further limit the upper oscillating frequency of the VCO.

In FIG. 1, a latched-type voltage controlled oscillator (VCO) 10 includes cross-coupled NAND gates I53 and I54 each having A and B inputs and a Y output with the output of I53 coupled to node c3 and the output of I54 coupled to node d3. Node c3 is coupled to the B input of I54 and to node c4 by invertor I55. Node d3 is coupled to the B input of I53 and to node d4 by invertor I56. The A input of I53 is coupled to node c2 and the A input of I54 is coupled to node d2.

Node c4 is coupled to the gate of N-channel transistor N18 and to a VCOB output pin via invertor I74. Node d4 is coupled to the gate of N-channel transistor N17 and to a VCO output pin via invertor I75. Transistor N17 has its source coupled to ground and its drain coupled to node c1 and transistor N18 has its source coupled to ground and its drain coupled to node d1. P-channel transistors I19 and I20 function as current sources to charge nodes c1 and d1 respectively when either N17 or N18 are off.

NAND gates I68 and I67 form a gating network 12 for the oscillator. The A input of I68 is coupled to the output of a start-up circuit 14, the B input is coupled to node c1, and the Y output is coupled to node c2. The A input of I67 is coupled to node d1, the B input is coupled to a sleep signal input, s1, through invertor I71, and the Y output is coupled to node d2. The start-up circuit 10 has i1 and i2 inputs coupled to nodes c2 and d2 respectively.

The operation of the system depicted in FIG. 1 will now be described with reference to table 1 and FIGS. 1, 2, and 3. The truth table for the NAND gates having inputs A and B and output Y is as follows:

TABLE 1

| A | B | Y |
|---|---|---|
| L | L | H |
| L | H | H |
| H | L | H |
| H | H | L | where H stands for a high voltage level and L stands for a low voltage level.

FIG. 2 sets forth the voltage level of the signals at each node at the voltage level transition time for a signal at one of the nodes. In the following discussion the symbols c1, c2, c3, c4, d1, d2, d3, and d4 will be used to identify the nodes of the feedback paths and the voltage signals generated at those nodes. FIG. 3 depicts the voltage/time waveforms for each node. During normal operation, the sleep input s1 is low so that the B input of I67 is H and the output of the start-up circuit 14 is H so that the B input of I68 is H.

At time t0, c2 transitions from L to H, N18 is OFF so that node d1 is charging, and N17 is ON so that c1 is L. The circuit is ready for the d1 transition. The nodes c1 and d1 have a small inherent capacitance which is depicted schematically by first and second capacitors 20 and 22.

At t1, node d1 is charged to the threshold voltage of NAND gate I67. Thus, the H voltage level of an input signal is defined as the threshold voltage level of the device it triggers. The "?" under d1 and c1 indicates that the voltage level is low but is increasing toward the threshold H level.

At t2, d2 transitions from H to L in response to the previous transition of d1 and, at t3, d3 transitions from L to H in response to the previous transition of d2. Note that from t0 to t3 there have been no voltage transitions in the first feedback path.

A first interaction between the second and first feedback paths takes place in response to the transition of d3 at t3. As depicted in FIG. 1, the NAND gates I67 and I68 are cross-coupled. Thus, the transition of d3 causes c3 to transition from H to L and also causes d4 to transition from H to L at t4. The transition of d4 turns OFF the discharging transistor N17.

A second interaction takes place in response to the turning OFF of N17 by the d4 transition at t4. At t5, the node c1 starts charging because N17 is OFF and c4 transitions from L to H at t5 in response to the c3 transition at t4. The transition of c4 turns ON the discharging transistor N18.

A third interaction between the feedback paths takes place in response to the turning ON of N18 by the c4 transition at t5. The node d1 is discharged and d1 transitions from H to L and c1 is charging at about t6. The discharging transistor N18 conducts much harder than I20 to discharge d1 and, as is apparent from the waveform of d1, the voltage level of d1 falls off very rapidly.

At t7, d2 transitions from L to H and c1 is charging. The circuit is now ready for the d1 transition which takes place at t8. The VCO then continues to make c1 and d1 transitions in the manner described above.

The time between the d1 and c1 transitions is from t1 to t8. The interval from t5 to t8 is determined by the charging rate of c1 which, as described more fully below, is dependent on the magnitude of the input voltage cpout and other circuit parameters. However, the time interval from t1 to t5 is not dependant on the input voltage but is determined by the magnitudes of the fixed delays of the NAND gates I67, I68, I53 and I54 and the other circuit elements in the feedback paths.

The amount of charging current supplied by I19 and I20 is determined by the magnitude of r-11 and cpout as follows. The resistor r-11 has a first terminal coupled to Vcc and a second terminal coupled to the source of I7 at a current summing node 30. Accordingly, the voltage drop across r-11 is approximately equal to the difference of Vcc and the quantity cpout - Vgs(I7). The magnitude of the current through I7 that flows through the summing node 30 is equal to (Vcc-cpout-Vgs(I7))/r-11. This current is mirrored to I19 and I20 via I41 and through the current mirror formed by N8 and N40.

The sum of the fixed delays due to the circuit elements in the feedback path is the minimum time between transitions of nodes c1 and d1 and fixes a lower limit on that switching time. Since the frequency of the output is inversely proportional to the magnitude of the transition time, the magnitude of the sum of the fixed delays determines an upper limit on the VCO output frequency. Accordingly, the number of circuit elements in the feedback path from node c1 to node d4 must be minimized to operate at high frequencies. Therefore, the start-up circuit 14 is located outside of the feedback paths to avoid adding fixed delays into the feedback paths.

Figure 4:
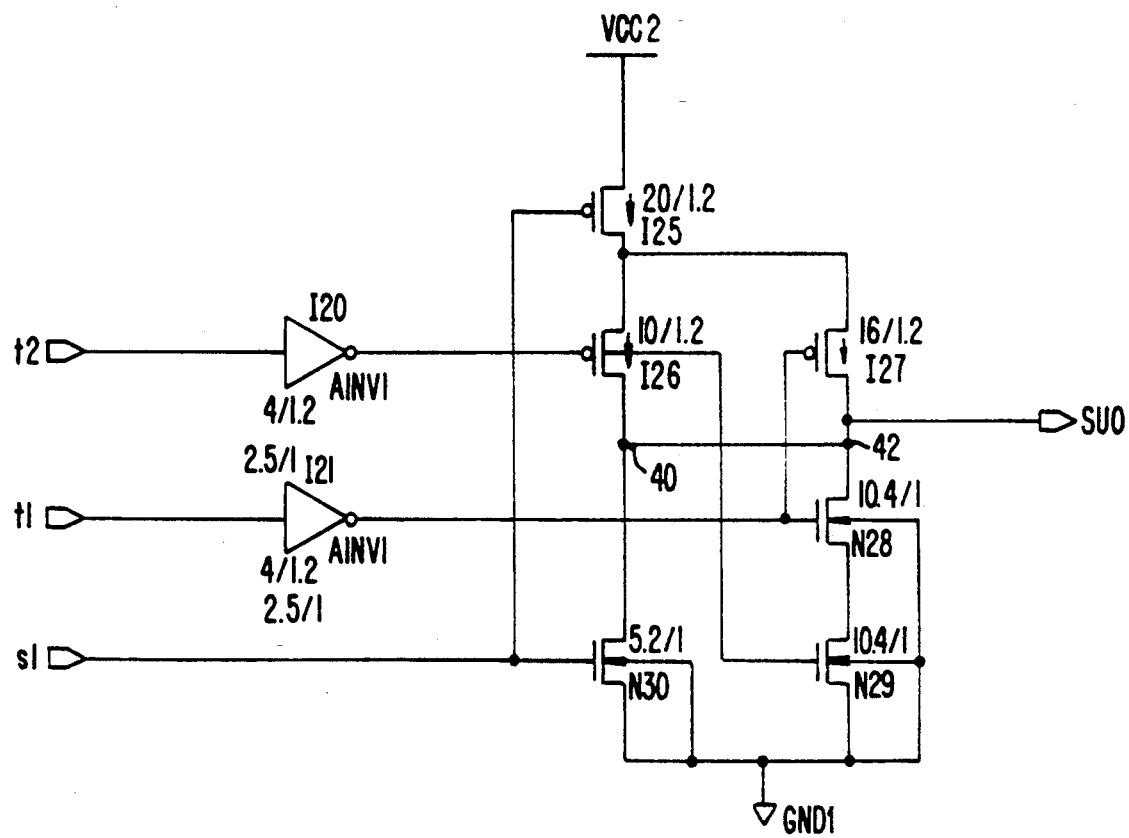
FIG. 4 is a schematic diagram of a start-up circuit included in the VCO of FIG. 1.
Figure 5:
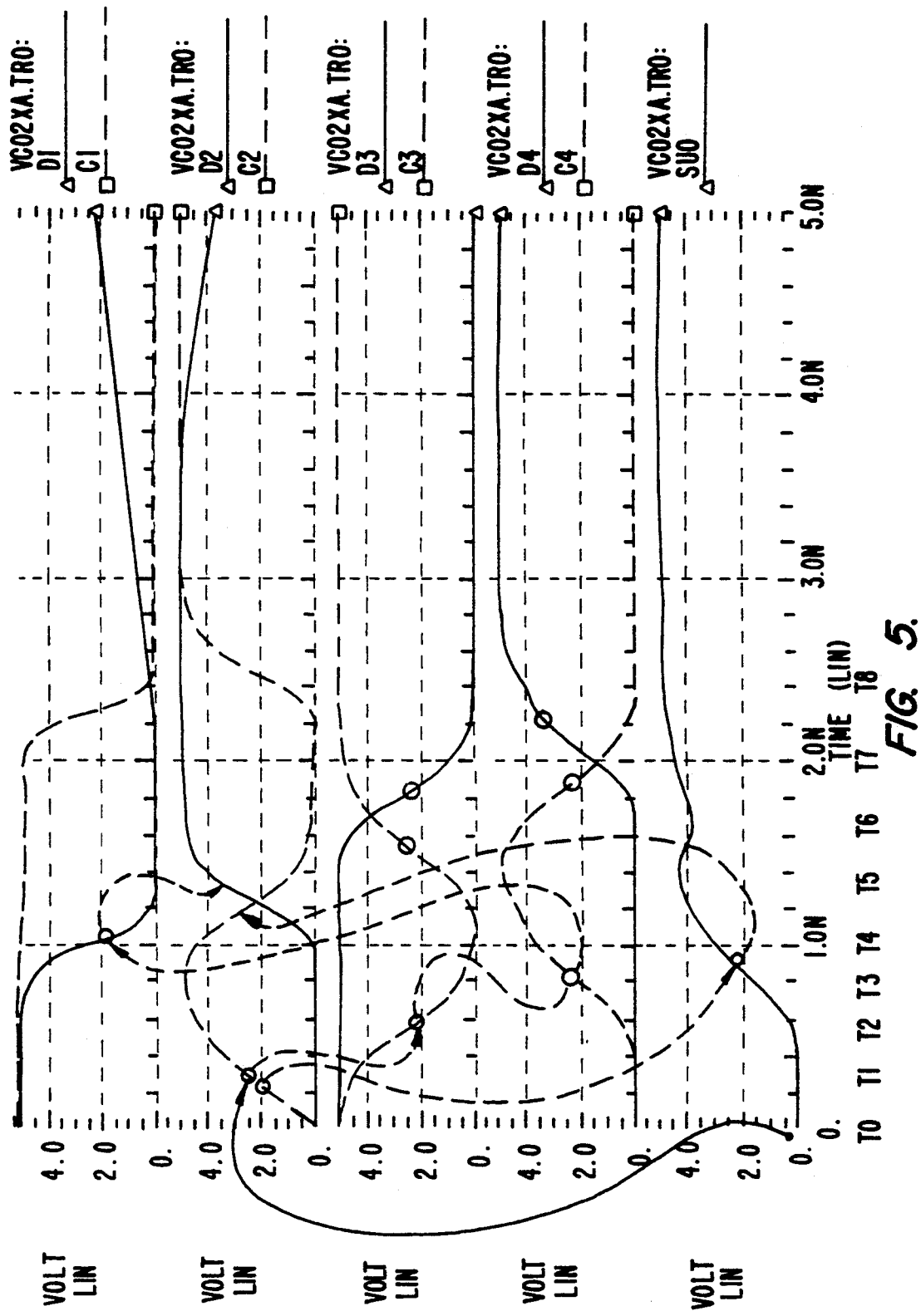
FIG. 5 is a graph depicting the waveforms of the voltage signals during start-up.

The function of the start-up circuit 14 will now be described with reference to FIGS. 4 and 5. FIG. 4 is a circuit diagram of the start-up circuit 14 and FIG. 5 depicts the waveforms of the voltage levels at the nodes of the first and second feedback paths and of SU0. In FIG. 4, a first terminal of P-channel transistor I25 is coupled to VCC and a second terminal is coupled to a first series circuit comprising P-channel transistor I26 and N-channel transistor N30 which are coupled at a first node and to a second series circuit comprising P-channel transistor I27 and N-channel transistors N28 and N29. I27 and N28 are coupled at a second node. Input i2 is coupled to the input of an invertor I20 with the output of I20 coupled to the gates of transistors I26 and N29. Input i1 is couple to the input of an invertor I21 with the output of I21 coupled to the gates of transistors I27 and N28. Input s1 is coupled to the gates of I25 and N30.

When the sleep input signal s1 is low the start-up circuit 14 functions as a negated NAND gate characterized by the truth table depicted in table 2.

TABLE 2

| i1 | i2 | SUO |
|----|----|-----|
| L | L | L |
| L | H | H |
| H | L | H |
| H | H | H |

When the sleep input signal s1 is high I25 is off and N30 is on so that SUO is always tied to ground and is L.

Since the VCO depicted in FIG. 1 is a latched-type VCO the function of the start-up circuit 14 is to prevent the VCO from going into a stable state during start-up. If at start-up, s1 is low, SUO is H, and both transistors N17 and N18 are off then nodes c1 and d1 are charged, all the inputs to I68 and I67 are H, nodes c2 and d2, c3 and d3 are high, c4 and d4 are low, there is no oscillation and the circuit is stable. However, from table 2, if c2 and d2 were low then SUO is switched to L making the circuit unstable.

In FIG. 5, at T0, nodes c1 and d1 are charged because N17 and N18 are OFF, nodes c2 and d2 are low, and SUO has switched from H to L. At T1 the output of NAND gate I68 switches in response to SUO being low to transition c2 from L to H The transition of c2 causes c3 to transition from H to L at T2 which causes c4 to transition from L to H at T3. The transition of c4 turns on N18 to discharge d1 and causes the transition of d1 from H to L at T4. Thus, the SUO output signal switching from H to L at T0 causes a chain of transitions in the first feedback path resulting in the discharge of d1 and the SUO transition substitutes for the switching low of the c1 signal which occurs during normal operation of the VCO as described above.

The transition of d1 causes subsequent transitions of d2 at T5, d3 at T6, and d4 at T7 to turn on N17 and discharge c1 to cause c1 to transition from H to L at T8.

Referring back to FIG. 3, during normal operation c1 starts charging at the same time d1 is discharged but, during start-up, c1 is still H at T4. However, during start-up, the transition of c2 at T1 causes a transition of SUO from L to H at about T4. The start-up circuit 14 is designed to react more slowly to input changes than the normal gates in the VCO and to introduce a fixed, slow delay between the transition of c2 from L to H and the transition of SUO from L to H that is about equal to the interval between T1 and T4. At about T5 this transition of SUO to H causes c2 to transition from H to L. This transition of c2 causes c3 to transition from L to H at T6 and c4 to transition from H to L at T7 to turn off N18 and start charging d1. Thus, the SUO output signal switching from L to H at T4 causes a chain of transitions in the first feedback path resulting in the charging of d1.

The fixed delay introduced by the start-up circuit 14 synchronizes the transitions of c4 and d4 to turn OFF N18 and turn ON N17 at about the same time.

Figure 3:
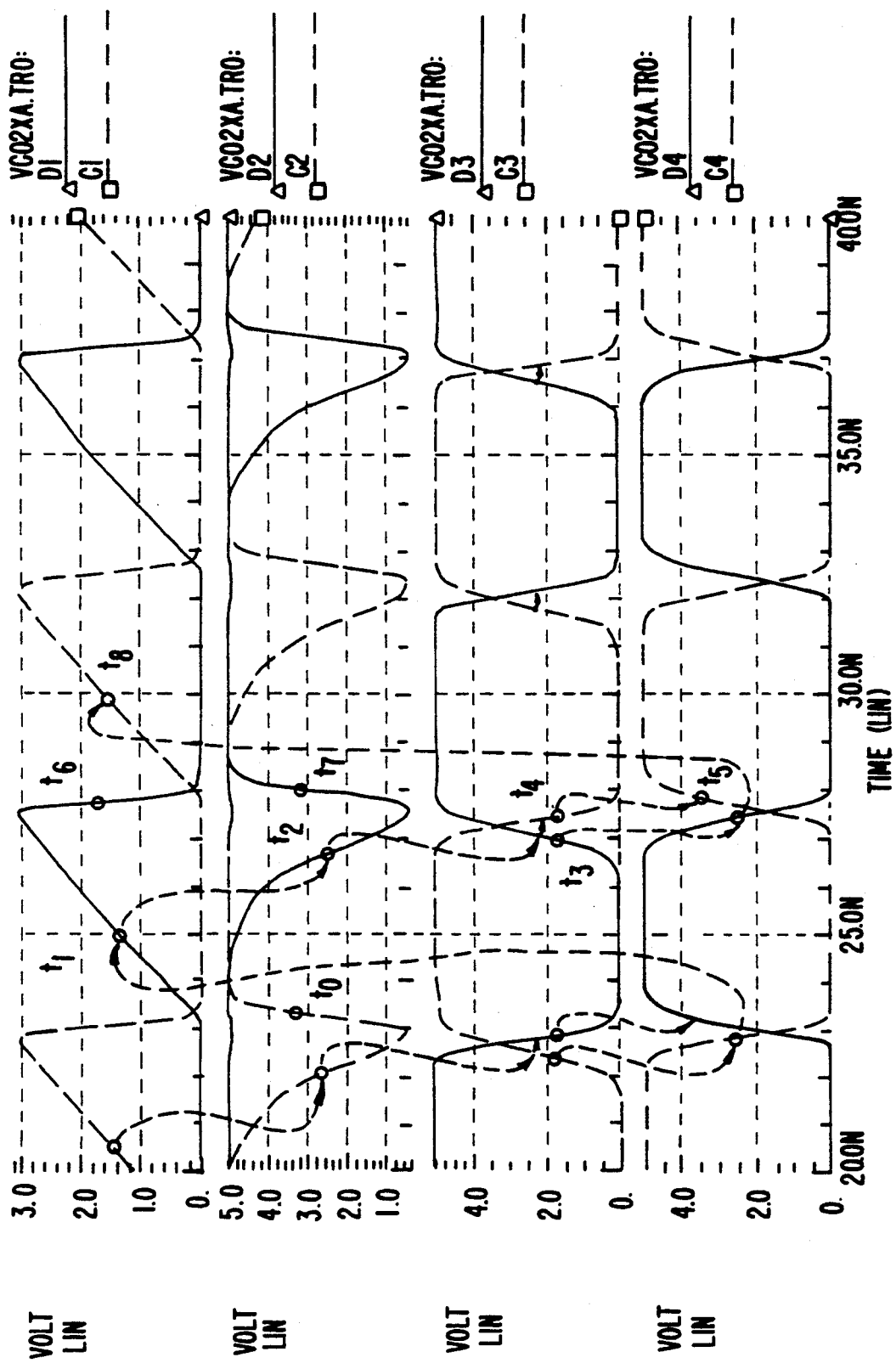
FIGS. 3 is a graph depicting the waveforms of the voltage signals during normal operation.

Thus at T8 the circuit is at the same point as t0 of the waveforms of FIG. 3 depicting the normal operation of the VCO and the VCO operates as described above.

In the VCO depicted in FIG. 1 the start-up circuit 14 is not included in either of the feedback paths from nodes c1 and d1 to the gating circuit. Accordingly, no fixed delays due to start-up circuitry are introduced so that the maximum frequency of operation of the VCO is not reduced.

In the sleep mode, i.e., when s1 is H, SUO and the B input of I68 is kept at L so that node c2 is kept at H. Additionally, when s1 is H the B input of I67 is held L so that node d2 is held H. No oscillation is possible when nodes c2 and d2 are held H so that the circuit elements in the latch-type oscillator draw no current during the sleep mode. Additionally, when s1 is H transistor I70 is ON and holds the gate voltage of I7 at VCC to turn OFF I7 to prevent current flow. Accordingly, during the sleep mode the VCO draws no power so that the sleep mode is used to conserve power when the oscillating output signal is not being used.

Figure 7:
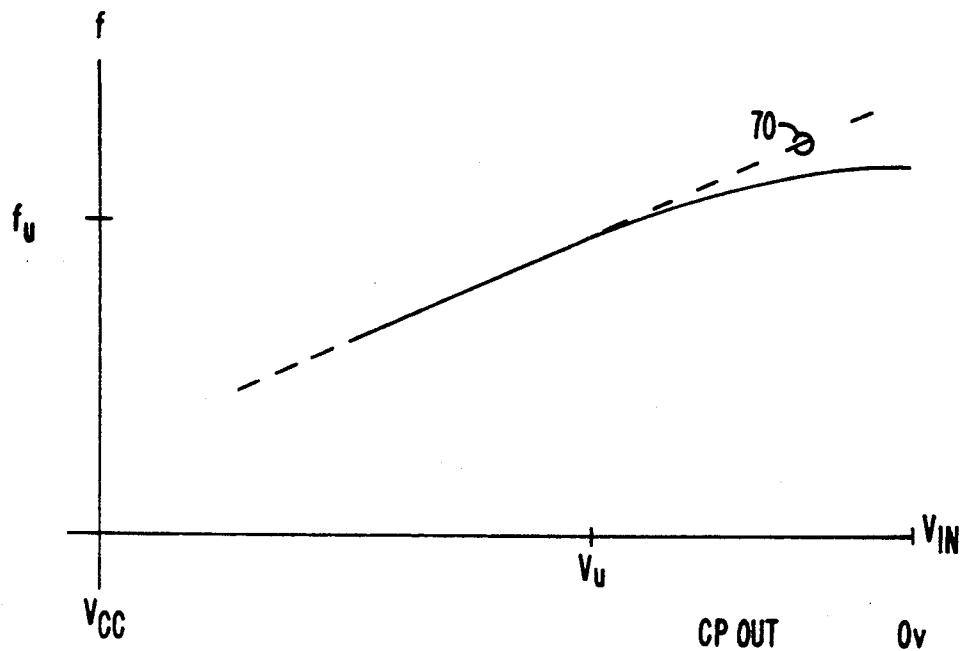
FIG. 7 is a graph depicting the dependence of frequency on input voltage.

Ideally, the frequency of the VCO output signal depends linearly on the input voltage. FIG. 7 is a graph schematically depicting the actual dependence of the frequency of the output signal, d4, on the input voltage, cpout. At a critical upper frequency, $f_u$, which occurs when the voltage at the cpout is equal to $v_u$, the actual frequency dependence on the input voltage is less than linear because of the effect of the fixed delays of the feedback paths. In the present invention, this problem is solved by increasing the current provided to the charging nodes c1 and d1 in a non-linear manner for frequencies higher than $f_u$.

Figure 6:
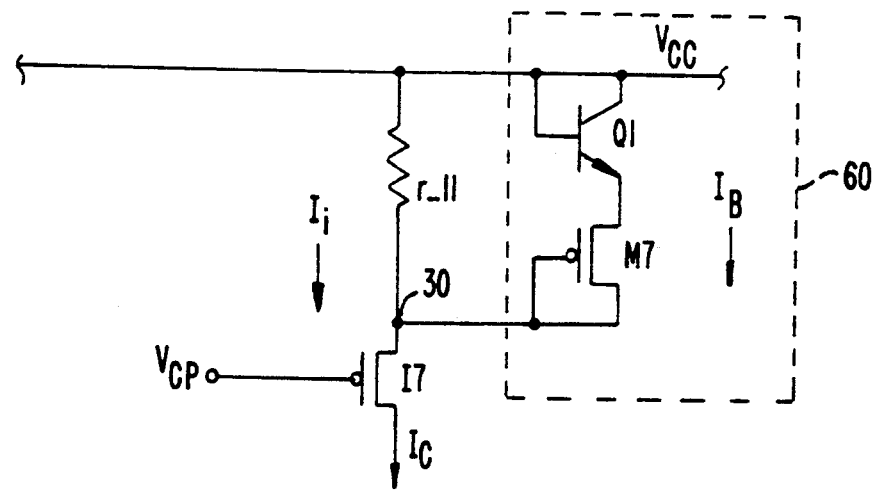
FIG. 6 is a schematic diagram of a circuit for linearizing the frequency gain at high frequencies.

FIG. 6 depicts a current boost circuit 60 coupled to the series circuit of r-11 and I7 of FIG. 1. The current boost circuit 60 includes Q1 and M7 serially connecting VCC to the summing node 30. The base of Q1 is coupled to VCC and the gate of M7 is coupled to the summing node 30. The charging current, $I_C$, is the sum of the linear current, $I_L$, conducted through r-11 and a boost current, $I_B$, provided by the boost circuit 60.

As described above with reference to FIG. 1, the voltage drop across resistor r-11 is approximately equal to (VCC - cpout-Vgs(I7)). In operation, M7 is off until the magnitude of this voltage drop is greater than sum the threshold voltage of M7 and the diode voltage drop of Q1. The circuit components are scaled so that M7 turns on when the voltage drop across r-11 is equal to $(-v_u)$.

Figure 8:
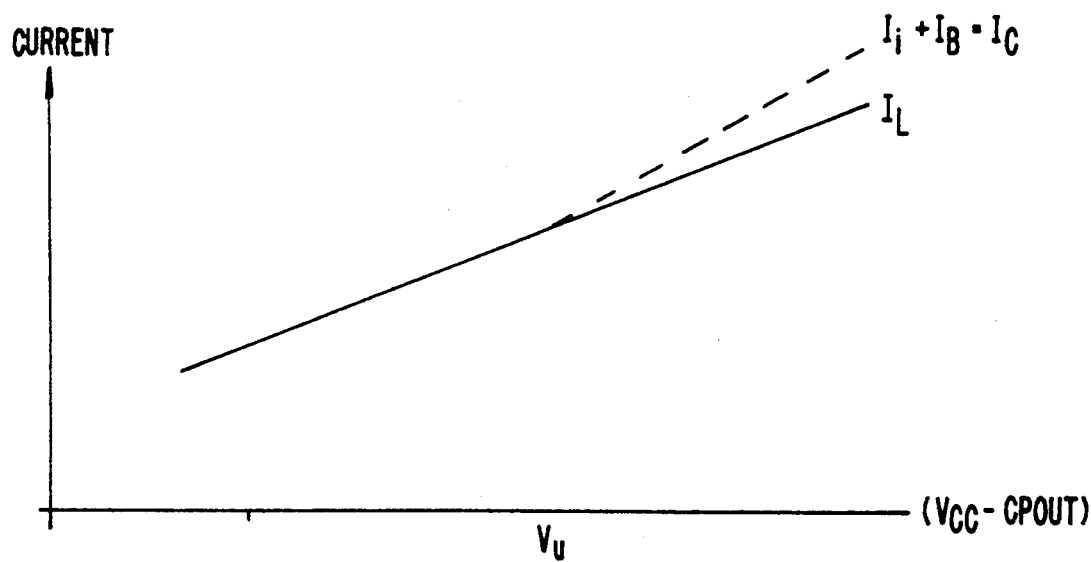
FIG. 8 is a graph depicting the dependence of charging current on input voltage.

FIG. 8 depicts the dependence of the magnitude of $I_C$ on the voltage drop across r-11. When the input voltage is greater than $v_u$ the magnitude of $I_C$ increases in a non-linear manner because of the contribution of $I_B$. As described above, transistors N8, N40, and I41 function to mirror $I_C$ through the charging transistors I19 and I20.

This boost current reduces the time required to charge the charging nodes c1 and d1 up to the trigger voltage level of the NAND gates I67 and I68 and increases the rate of change of frequency, as depicted by the dashed line 70 in FIG. 7, for input voltages above $v_u$ to compensate for the effects of the fixed delays at high frequencies. Accordingly, the nonlinear increase in the charging current causes the frequency dependence above $f_u$ to be approximately linear.

As described above, the operating frequency of the VCO is partially determined by the magnitudes of the fixed delays introduced by NAND gates and other circuit elements in the feedback paths. These fixed delays change when the magnitude of the power supply voltage, VCC, changes and thus a drift in the power supply voltage causes a drift in the magnitude of the operating frequency. The effects of power supply drift are compensated in a preferred embodiment.

Figure 9:
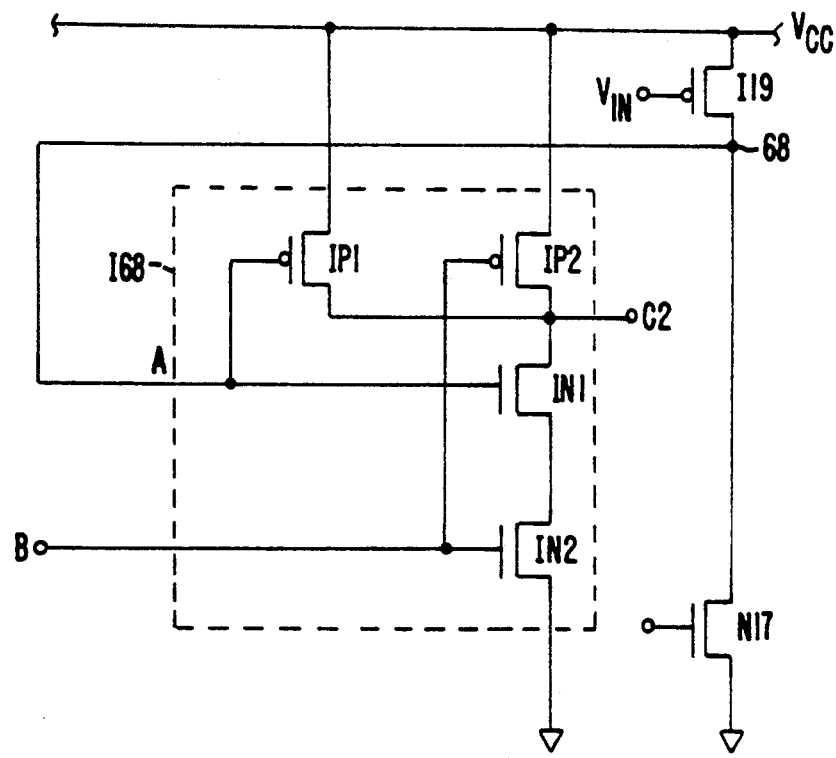
FIG. 9 is a detailed schematic diagram of a CMOS NAND gate utilized in the VCO depicted in FIG. 1.

FIG. 9 is a circuit diagram of the CMOS NAND gate I68 having its A input coupled to the charging node c1. If VCC increases than the source voltage of INI increases to increase the trigger voltage of the NAND gate. Accordingly, the charging time, $t_c$, required charge to node d1 to the trigger voltage increase as the supply voltage increases. The transistors in the CMOS NAND gates are scaled so that the change of $t_c$ caused by the change of trigger voltage due to fluctuating power supply voltage is cancelled by the change in $t_c$ caused by the change of delay time in the NAND gates and invertors due to fluctuating power supply voltage.

Additionally, high-frequency power supply noise is decoupled from the circuit by capacitors formed by transistors I44 and N43.

The invention has now been described with reference to the preferred embodiments. Alternatives and substitutions will now be apparent to persons of ordinary skill in the art. For example, the polarities of many of the transistors could be changed while implementing the principle of the invention. Additionally, transistor Q1 in the boost circuit is used to program the turn-on voltage of the boost circuit. Different numbers of diodes or other circuit structures could be utilized to further program this voltage. Accordingly, it is not intended to limit the invention except as provided by the appended claims.

What is claimed is:

1. A high-frequency voltage controlled oscillator comprising:

a first frequency control circuit including a first charging transistor having a first terminal coupled to a first reference voltage level, a control terminal, and a second terminal coupled to a first charging node and a first discharging transistor having a first terminal coupled to said first charging node, a control terminal, and a second terminal coupled to a second reference voltage level;

a second frequency control circuit including a second charging transistor having a first terminal coupled to said first reference voltage level, a control terminal, and a second terminal coupled to a second charging node and a second discharging transistor having a first terminal coupled to said second charging node, a control terminal, and a second terminal coupled to said second reference voltage level;

a first feedback path coupling said first charging node to the control terminal of said second discharging transistor, said first feedback path including a plurality of serially connected circuit elements, a first node disposed between two of said serially connected circuit elements which is charged to one of either a first or second voltage level during operation, a first control input coupled to said first charging node, and a second control input;

a second feedback path coupling said second charging node to the control terminal of said first discharging transistor, said second feedback path including a plurality of serially connected circuit elements, a first node disposed between two of said serially connected circuit elements which is charged to either said first or second voltage level during operation, a first control input coupled to said second charging node, and a second control input;

a start-up circuit, not forming part of said first or second feedback paths, having first and second input terminals coupled to the first nodes of said first and second feedback paths and having an output terminal coupled to the second control input of said first feedback path for providing said first voltage level to said control input of said first feedback paths when said first nodes of said first and second feedback paths are charged to different voltage levels and for providing said second voltage level when said first nodes are charged to the same voltage level to prevent the voltage controlled oscillator from entering a stable state.

2. The voltage controlled oscillator of claim 1 where said start-up circuit further comprises:

means, coupled to receive a sleep mode control signal, for providing said second voltage level to the second control input of said first feedback path when said sleep mode control signal is at a predetermined voltage level;

and wherein said voltage controlled oscillator further comprises:

means, coupled to receive said sleep mode signal, for providing said second voltage level to the second control input of said second feedback path when said sleep mode control signal is at said predetermined voltage level.

3. The voltage controlled oscillator of claim 1 wherein said start-up circuit comprises:

a NAND gate having a first input coupled to the first node of the first feedback path through a first invertor and having a second input coupled to the first node of the second feedback path through a second invertor and having an output coupled to the second control input of the first feedback path.

4. The voltage controlled oscillator of claim 1 further comprising:

a linear series circuit including a resistor having a first terminal coupled to said first reference voltage and a second terminal coupled to a boost control node and a first transistor having a first terminal coupled to said boost control node, a control terminal coupled to an input voltage level, and a second terminal, with the linear charging circuit for providing a linear current controlled by said input voltage level;

a boost circuit comprising a boost transistor, having a first terminal coupled to said first reference voltage level and a second terminal and control terminal coupled to the boost control node, with the boost circuit for providing a boost current when the voltage drop across said resistor is sufficient to turn on said boost transistor; and current mirroring means, coupling the second terminal of said first transistor to the control terminals said first and second charging transistors, for providing control voltages at said control terminals to mirror the sum of the linear current and boost current provided by said first series circuit and said boost circuit.

5. The voltage controlled oscillator of claim 1 wherein:

the first and second control inputs of each feedback path are the input of a CMOS NAND gate, that includes N-channel transistors, coupled to receive the first reference voltage level, and characterized by a trigger voltage having a magnitude depending on the magnitude of the first reference voltage level and wherein;

the N-channel transistors are scaled so that the magnitude of the trigger voltage changes to compensate for a change in charging current supplied by said first and second charging transistors due to changes in the magnitude of said first reference voltage level.

6. The voltage controlled oscillator of claim 1 wherein said start-up circuit comprises:

means for causing delaying the transition from said second voltage level to said first voltage level in response to a change of the voltage levels in said control input by a time duration approximately equal to a fixed delay of said feedback paths.

* * * * *